United States Patent
Ohtani et al.

(10) Patent No.: US 6,558,993 B2
(45) Date of Patent: May 6, 2003

(54) SEMICONDUCTOR DEVICE AND METHOD OF MANUFACTURING THE SAME

(75) Inventors: Hisashi Ohtani, Kanagawa (JP); Shunpei Yamazaki, Tokyo (JP); Masataka Itoh, Nara (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 45 days.

(21) Appl. No.: 09/860,184

(22) Filed: May 17, 2001

(65) Prior Publication Data

US 2001/0025960 A1 Oct. 4, 2001

Related U.S. Application Data

(62) Division of application No. 09/464,189, filed on Dec. 16, 1999, now Pat. No. 6,259,138.

(30) Foreign Application Priority Data

Dec. 18, 1998 (JP) .......................... 10-361563

(51) Int. Cl.⁷ ..................... H01L 21/00; H01L 21/84
(52) U.S. Cl. ..................... 438/153; 438/154; 438/158; 438/161; 438/163
(58) Field of Search ..................... 438/129, 149, 438/151, 152, 153, 154, 155, 156, 158, 159, 161, 163, 587, 582, 588; 257/351, 59, 72, 350, 411, 412

(56) References Cited

U.S. PATENT DOCUMENTS

| 5,359,219 A | 10/1994 | Hwang ........................ 257/351 |
| 5,412,240 A | 5/1995 | Inoue et al. ................. 257/347 |
| 5,482,871 A | 1/1996 | Pollack ......................... 437/21 |
| 5,567,966 A | 10/1996 | Hwang ........................ 257/347 |
| 5,643,826 A | 7/1997 | Ohtani et al. ................. 437/88 |
| 5,923,962 A | 7/1999 | Ohtani et al. ................. 438/150 |
| 6,015,997 A | 1/2000 | Hu et al. ....................... 257/412 |
| 6,078,060 A * | 6/2000 | Shibuya et al. ................ 257/66 |
| 6,096,630 A | 8/2000 | Byun et al. ................... 438/592 |
| 6,118,163 A | 9/2000 | Gardner et al. ............. 257/412 |
| 6,391,694 B1 * | 5/2002 | Zhang et al. ................. 438/164 |

FOREIGN PATENT DOCUMENTS

| JP | 7-130652 | 5/1995 |
| JP | 8-078329 | 3/1996 |
| JP | 10-135468 | 5/1998 |
| JP | 10-135469 | 5/1998 |

OTHER PUBLICATIONS

Hatano, M. et al, "A Novel Self–Aligned Gate–Overlapped LDD Poly–Si TFT with High Reliability and Performance," IEDM 97, pp. 523–526, IEEE 1997.
English abstract re Japanese patent application No. JP 7–130652 published May 19, 1995.
English abstract re Japanese patent application No. JP 8–078329 published Mar. 22, 1996.
English abstract re Japanese patent application No. JP 10–135468 published May 22, 1998.
English abstract re Japanese patent application No. JP 10–135469 published May 22, 1998.

* cited by examiner

Primary Examiner—Phat X. Cao
Assistant Examiner—Theresa T. Doan
(74) Attorney, Agent, or Firm—Cook, Alex, McFarron, Manzo, Cummings & Mehler, Ltd.

(57) ABSTRACT

There is provided a semiconductor device using a TFT structure of high reliability.

A gate electrode of a TFT includes a first conductive layer, a second conductive layer, and a third conductive layer. An LDD region has a part which overlaps the gate electrode via a gate insulating film and a part which does not overlap the gate electrode. As a result, this can prevent the deterioration when the TFT is on and can reduce a leakage current when the TFT is off.

35 Claims, 11 Drawing Sheets

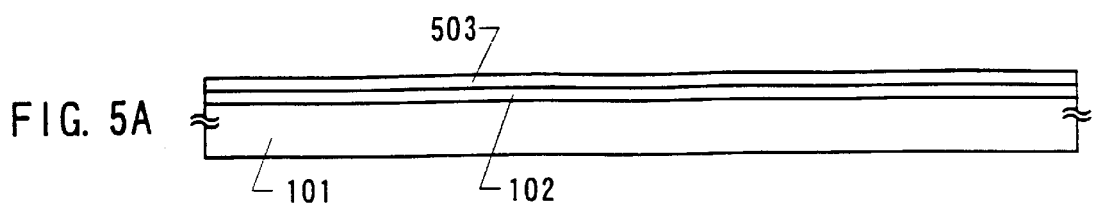
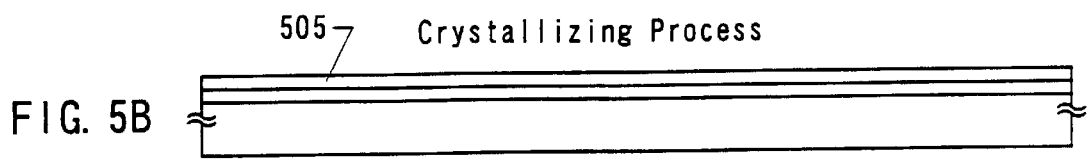
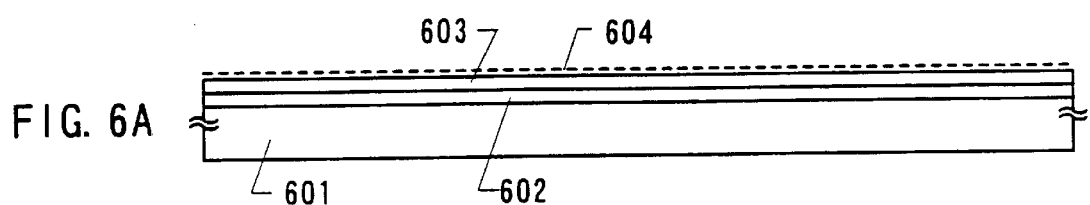
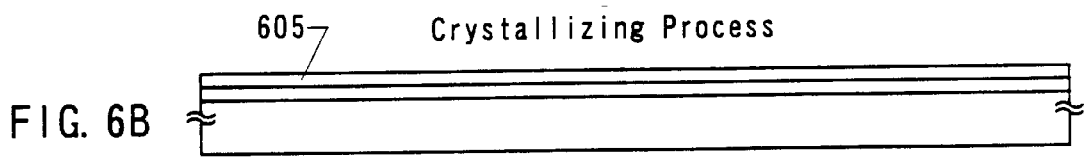
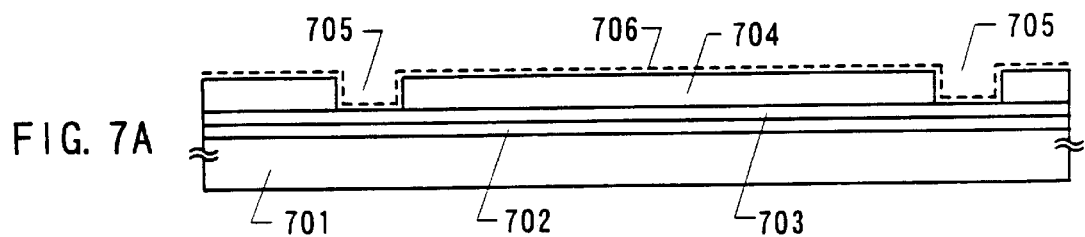
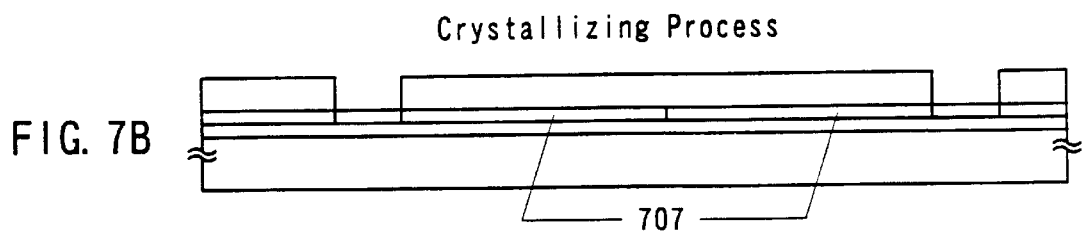

SEMICONDUCTOR DEVICE AND METHOD OF MANUFACTURING THE SAME

This application is a divisional of U.S. application Ser. No. 09/464,189, filed on Dec. 16, 1999 now U.S. Pat. No. 6,259,138.

BACKGROUND OF THE INVENTION

1. Field of the Invention

The present invention relates to a method for manufacturing a semiconductor device utilizing a crystalline semiconductor film formed by crystallizing an amorphous semiconductor film, and, in particular, to a semiconductor device of a thin film transistor (hereinafter referred to as a TFT) or the like and a method for manufacturing the semiconductor device. A semiconductor device in accordance with the present invention includes not only a device such as a thin film transistor (TFT), a MOS transistor, or the like, but also a display device having a semiconductor circuit constituted by these insulating gate type transistors and an electrooptical device such as an image sensor, or the like. In addition, the semiconductor device in accordance with the present invention includes an electronic device mounted with the display device and the electrooptical device.

2. Description of the Related Art

Since a TFT can be formed on a transparent glass substrate, a development of applying the TFT to an active matrix type display device has actively been made. The active matrix type display device displays an image of high definition by controlling an electric field applied to liquid crystal in a matrix by a plurality of pixels arranged in the form of a matrix. Since the TFT utilizing a crystalline semiconductor film has a high mobility, it is possible to realize a high-resolution image display by integrating a functional circuit on the same substrate.

The active matrix type display device needs one million TFTs only for pixels so as to produce a high-resolution image display and needs the more TFTs to add a functional circuit in addition to the pixels, and in order to operate a liquid crystal display device stably, it has been necessary to ensure the reliability of each TFT and to operate it stably.

Since the specification required of an actual liquid crystal display device (also, referred to as a liquid crystal panel) is severe, in order to operate all pixels normally, pixels and drivers need to be of high reliability. In particular, when abnormal conditions occur in a driver circuit, a malfunction occurs in one column (or one row) of the pixel to cause a line defect.

Also, it is said that a TFT utilizing polysilicon is not comparable in reliability to a MOSFET (which is a transistor formed on a single crystal semiconductor substrate) used for an LSI or the like. There is a growing feeling that it is difficult to make an LSI circuit of the TFT unless this weakness is overcome.

The present applicant thought that a MOSFET had three advantages in reliability for the following reasons. FIG. 13(A) is a schematic view of a MOSFET. Reference numeral 1 designates a drain region formed on a single crystal silicon substrate, a numeral 2 designates a light doped drain region (hereinafter referred to as an LDD region), numeral 3 designates a field insulating film, and numeral 5 designates a gate insulating film 5 under a gate wiring 4.

Here, the present applicant thought that the MOSFET had three advantages. The first advantage is that there is a gradient in an impurity concentration from an LDD region 2 toward a drain region 1. As shown in FIG. 13(B), an impurity concentration increases from an LDD region 2 toward a drain region 2 in a conventional MOSFET. The present applicant thought that this gradient was effective in improving the reliability of the MOSFET.

Next, the second advantage is that the LDD region 2 overlaps a gate wiring 4. A gate overlapped light-doped drain (hereinafter referred to as GOLD) or a large-tilt-angle-implanted drain (hereinafter referred to as LTAID) is well known as such a structure. This structure can reduce the impurity concentration in the LDD region 2 and can increase an electric field relaxation effect, thereby increasing a hot carrier resistance.

Next, the third advantage is that there is a certain distance between the LDD region 2 and the gate wiring 4. This is because a field insulating film 3 sinks under the gate wiring 4. That is, since the thickness of the gate insulating film increases only at an overlapping portion, it is expected that the electric field will be effectively relaxed.

As described above, it is thought that the conventional MOSFET has some advantages compared with the TFT and hence has high reliability.

Also, an attempt has been made to apply these advantages of the MOSFET to the TFT. For example, M. Hatano, H. Akimoto, and T. Sakai realized a GOLD structure using a side wall formed of silicon, which was disclosed in IEDM97 TECHNICAL DIGEST, p523–526, 1997.

However, the structure disclosed in that paper presents a problem that an off-current (a current flowing when a TFT is in an off-state) increases compared with the conventional LDD structure and hence it was necessary to take countermeasures against the problem.

As described above, the present applicant thought that the problem in the structure of the TFT had an effect on the reliability thereof (in particular, a hot carrier resistance) when a comparison was made between the TFT and the MOSFET.

The present invention provides an art for overcoming the problem. It is an object of the present invention to realize a TFT having reliability equal to or higher than the reliability of the MOSFET. It is another object of the present invention to realize a highly reliable semiconductor device having a semiconductor circuit formed of such a TFT.

SUMMARY OF THE INVENTION

In order to solve the problems described above, a thin film transistor in accordance with the present invention has an n-type or a p-type first impurity region which functions as a source region or a drain region, and in addition to the first impurity region, two kinds of impurity regions (a second impurity region and a third impurity region) showing the same conductive type as that of the first impurity region, between the channel forming region and the first impurity region in a semiconductor layer in which a channel forming region is formed. The second impurity region and the third impurity region are lower in the concentration of the impurities which determines the conductive type than in the first impurity region and then function as high resistance regions.

The second impurity region is a low-concentration impurity region with a GOLD structure in which it overlaps a gate electrode via a gate insulating film and has an action of improving a hot carrier resistance, whereas the third impurity region is a low-concentration impurity region in which it does not overlap the gate electrode and has an action of preventing an increase in an off-current.

In this respect, in the present specification, a gate electrode is an electrode which crosses the semiconductor layer with an insulating film sandwiched therebetween and which applies an electric field to the semiconductor layer to form a depletion layer. In other words, a part of the gate wiring which crosses the semiconductor layer with an insulating film sandwiched therebetween is the gate electrode.

A constitution of the present invention disclosed in the present specification is a semiconductor device including a thin film transistor comprising a semiconductor layer, a gate insulating film formed on the semiconductor layer, and a gate electrode crossing the semiconductor layer via the gate insulating film, wherein the gate electrode is formed of a multilayer film including a first conductive layer, a second conductive layer, and a third conductive layer laminated in sequence on the gate insulating film, and wherein the semiconductor layer has a channel forming region and a pair of impurity regions of a conductive type and formed on both sides of the channel forming region, the pair of impurity regions partially overlapping the gate electrode via the gate insulating film.

Further, another constitution of the present invention is a semiconductor device including a thin film transistor comprising a semiconductor layer, a gate insulating film formed in contact with the semiconductor layer, and a gate electrode crossing the semiconductor layer via the gate insulating film, wherein the gate electrode is formed of a multilayer film including a first conductive layer, a second conductive layer, and a third conductive layer laminated in sequence on the gate insulating film, and wherein the semiconductor layer has a channel forming region, a first impurity region of a conductive type, a second impurity region which is sandwiched between the channel forming region and the first impurity region, is adjacent to the channel forming region and overlaps the gate electrode via the gate insulating film and has the same conductive type as the first impurity region and is lower in the concentration of impurity of the conductive type than the first impurity region, and a third impurity region which is sandwiched between the first impurity region and the second impurity region, does not overlap the gate electrode, has the same conductive type as the first impurity region, and is lower in the concentration of impurity of the conductive type than the first impurity region.

Further, still another constitution of the present invention is a semiconductor device including a CMOS circuit comprising an n-channel type thin film transistor and a p-channel type thin film transistor, wherein the CMOS circuit has a gate wiring crossing the semiconductor layer of the n-channel type thin film transistor and the semiconductor layer of the p-channel type thin film transistor via a gate insulating film, the gate wiring being formed of a multilayer film including a first conductive layer, a second conductive layer, and a third conductive layer laminated in sequence on the gate insulating film, the semiconductor layer of the n-channel type thin film transistor having a channel forming region, a first n-type impurity region, a second n-type impurity region which is sandwiched between the channel forming region and the first n-type impurity region, is adjacent to the channel forming region, overlaps the gate wiring via the gate insulating film, and is lower in the concentration of n-type impurity than the first n-type impurity region, and a third n-type impurity region which is sandwiched between the first n-type impurity region and the second n-type impurity region, does not overlap the gate wiring, and is lower in the concentration of the n-type impurity than the first n-type impurity region.

Also, a method of manufacturing a semiconductor device embodying the present invention comprises the steps of: forming a semiconductor layer; forming an insulating film on the semiconductor layer; forming a first photoresist mask which contacts the insulating film and crossing the semiconductor layer; a first addition of adding impurities of a predetermined conductive type to the semiconductor layer via the first photoresist mask; forming a gate electrode crossing the semiconductor layer via the insulating film, wherein the gate electrode is formed of a multilayer film including a first conductive layer, a second conductive layer, and a third conductive layer which are laminated in this order on the insulating film; forming a second photoresist mask which covers the gate electrode and is wider in the direction of the length of a channel than the gate electrode; and a second addition of adding impurities of the conductive type to the semiconductor layer via the second photoresist mask.

BRIEF DESCRIPTION OF THE DRAWINGS

FIG. 5 is an illustration, in the cross-section of a substrate, of a crystallizing process of the embodiment 1.

FIG. 6 is an illustration, in the cross-section of a substrate, of a crystallizing process of the embodiment 2.

FIG. 7 is an illustration, in the cross-section of a substrate, of a crystallizing process of the embodiment 2.

DESCRIPTION OF THE PREFERRED EMBODIMENTS

Figure 1A:
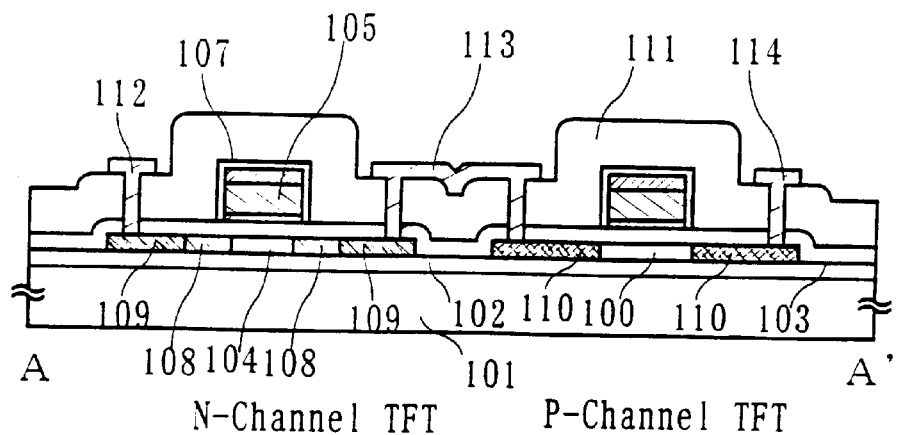
FIG. 1 is a plan view and a cross-sectional view of a CMOS circuit of the embodiment 1.

A preferred embodiment in accordance with the present invention will be described with reference to FIG. 1 to FIG. 3. Here, the preferred embodiment of manufacturing a CMOS circuit in which an n-channel type TFT is complementarily combined with a p-channel type TFT will be described.

First, a substrate 101 having an insulating surface is prepared. An insulating substrate such as a glass substrate, a quartz substrate, or the like can be used as the substrate 101. In order to improve the electric characteristics of the TFT by preventing the diffusion of impurities from the substrate, an underlayer insulating film (hereinafter referred to as an underlayer film) 102 is formed which is made of a silicon oxide film or the like. However, if it is not necessary to improve the electric characteristics of the TFT, it is acceptable that the underlayer film is not formed.

Next, an amorphous semiconductor film is formed. As the amorphous semiconductor film may be used an amorphous semiconductor film containing silicon, for example, an amorphous silicon film, an amorphous silicon film including microcrystals, a microcystalline silicon film, an amorphous germanium film, an amorphous silicon germanium film represented by $Si_xGe_{1-x}(0<x<1)$, or a laminated film of these films, and the thickness of the film may be 10 to 100 nm, more preferably, 15 to 60 nm.

Next, the amorphous semiconductor film is subjected to a crystallization treatment to form a crystalline semiconductor film. However, if a hydrogen concentration of the amorphous semiconductor film is as high as several tens percents, the amorphous semiconductor film is preferably subjected to a hydrogen concentration reducing treatment (a heat treatment at 400° C. to 500° C.) before it is subjected to the crystallization treatment. As the crystallization treatment, a well-known laser crystallization technology or a thermal crystallization technology can be used.

Then, semiconductor layers 201, 202 having a desired shape are formed by a well-known patterning technology. Next, a gate insulating film 103 made of a silicon oxide film or the like is formed to cover the above semiconductor layers 201, 202 (see FIG. 2(A)).

Next, a photoresist mask 203 covering a part of an n-channel type TFT (a region for forming a channel forming region) or a photoresist mask 204 covering a p-type channel type TFT are formed by the use of a photomask. Then, a process of adding impurity elements for transforming the semiconductor layer into an n-type semiconductor layer to the semiconductor layer by using the photoresist masks 203, 204 as masks (see FIG. 2(B)). An ion implanting method or an ion doping method can be used as a method of adding the impurity elements. An impurity for transforming the semiconductor layer into an n-type semiconductor layer is an impurity to be a donor, and is a Group 13 element, typically, phosphorus (P), or arsenic (As) for silicon and germanium. Also, a region 104 which is covered with the photoresist mask 203 and to which the impurity elements are not added in the adding process in FIG. 2(B) makes the channel forming region of an n-channel type TFT. Also, the photoresist mask 203 is narrower in the direction of the length of the channel than a gate electrode formed later. In this process, an impurity region ($n^-$ region) 205 is formed under the gate electrode formed later.

Figure 2A:
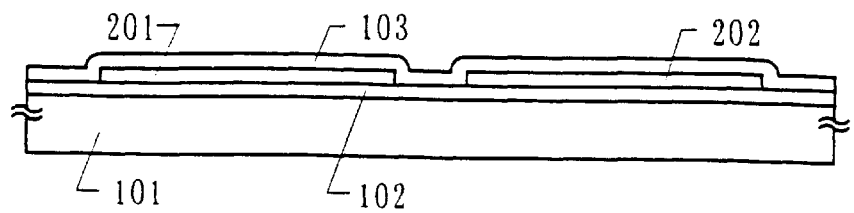
FIG. 2 is an illustration of a manufacturing process of a TFT of the embodiment 1.
Figure 2B:
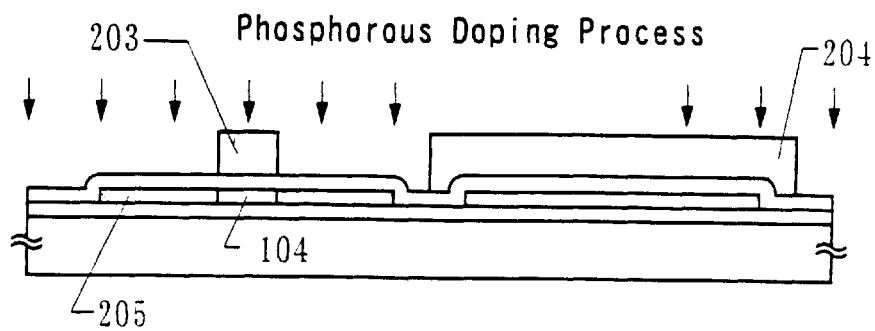
Figure 2C:
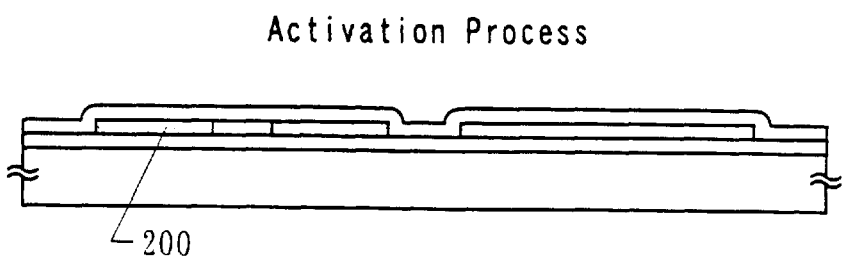

Next, the photoresist masks 203, 204 are removed and an activation process (a heat treatment, a laser annealing, or the like) of activating the impurities added to an impurity region ($n^-$ region) 205 is performed to form an activated impurity region ($n^-$ region) 200 (see FIG. 2(C)). In particular, although the activating process is not necessarily performed here, since a gate electrode is not yet formed, the impurity region overlapping the gate electrode to be later formed can be activated without taking into account the heat resistance temperature of the gate electrode.

Figure 2D:
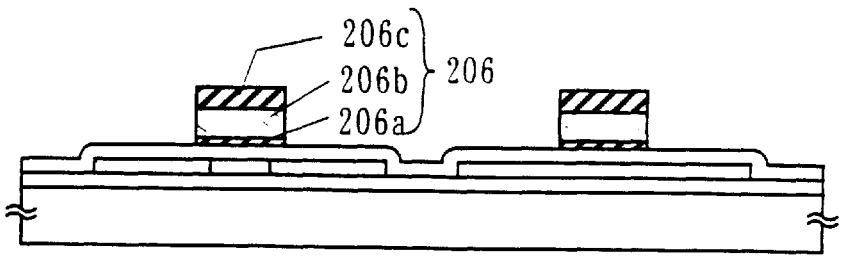

Next, a gate electrode 206 having a three-layer structure is formed on the gate insulating film (see FIG. 2(D)). The gate electrode 206 is formed by laminating conductive films by using a sputtering method and then by patterning them by a publicly known patterning technology. Also, the length of the gate electrode (wire width) is made 0.1 µm to 10 µm (typically, 0.2 µn to 5 µm). However, in order to performing an anodic oxidation in a subsequent process, all the gate electrodes need to be connected in one wiring.

The present invention is characterized in that the gate electrode 206 has a three-layer structure and that the first conductive layer 206a is made of a material whose main component (content: not less than 50%) is tantalum (Ta), the second conductive layer 206b is made of a material whose main component is aluminum (Al), and the third conductive layer 206c is made of a material whose main component is tantalum (Ta). For example, a combination of Ta/Al/Ta, or a combination of Ta/Al/TaN can be selected as a combination of the first conductive layer 206a/the second conductive layer 206b/the third conductive layer 206c.

If the three-layer structure is made such that the second conductive layer is sandwiched between the first conductive layer and the third conductive layer, since the third conductive layer is formed in contact with the top of the second conductive and the first conductive layer is formed in contact with the bottom of the second conductive layer, they can prevent the second conductive layer from producing hillocks thereon. Also, since the tantalum which is the main component of the first conductive layer 206a and the third conductive layer 206c has a high heat resistance, it makes a blocking layer preventing the diffusion of aluminum elements constituting the third conductive layer 206c. Also, the third conductive layer 206c makes a blocking layer for preventing the second conductive layer 206c from developing a short circuit with an upper wiring.

Figure 2E:
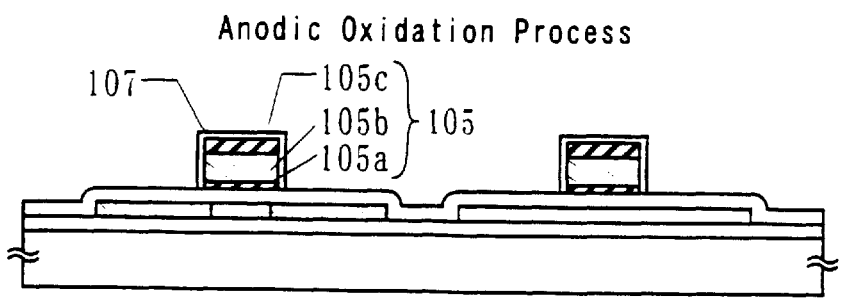

Next, the gate electrode 206 is subjected to an anodic oxidation process to form an anodic oxide film 107 on the side of the first conductive layer 105a, the side of the second conductive layer 105b, and on the top and the side of the third conductive layer 105c (see FIG. 2(E)). The anodic oxidation process is performed in an electrolytic solution, for example, an electrolytic solution made by neutralizing an ethylene glycol solution containing a tartaric acid with an aqueous ammonia (solution temperature is 10° C.), by using a gate wiring as an anode and platinum as a cathode. Since the anodic oxide film 207 produced in this way is a dense film, even if it is subjected to a doping process or a heat treatment, it can be prevented from flaking or producing hillocks thereon. In the invention, in particular, the second conductive layer is made of a material whose main component is aluminum having a low heat resistance, but the dense anodic oxide film (alumina film) formed on the side thereof is very effective in improving the heat resistance of the gate electrode. In this respect, the thickness of the alumina film required for improving the heat resistance of the gate electrode sufficiently is not less than 10 nm, and more preferably, not less than 30 nm.

Next, photoresist masks 208, 209 covering a part of an n-channel type TFT and a p-channel type TFT are formed. The photoresist mask 208 is wider in the direction of the length of the channel than the gate electrode. Also, the length of the first impurity region ($n^+$ region) is determined by the photoresist mask 208. Then, n-type impurities are added again to the semiconductor layer 201 by using the photoresist mask 208 as a mask. In this way, the first impurity region ($n^+$ region) 210 is formed (see FIG. 3(A)).

Figure 3A:
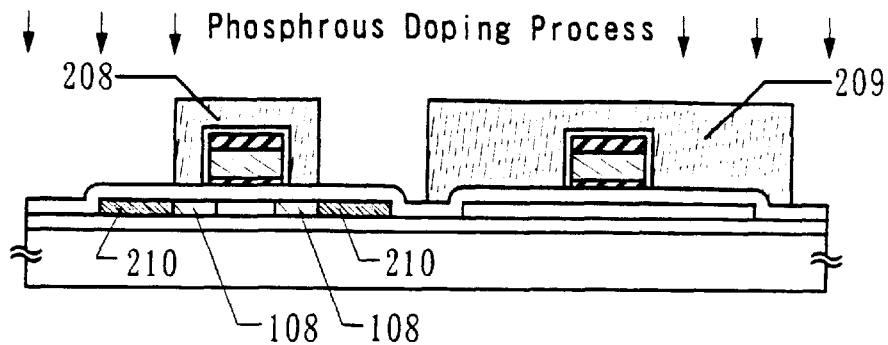
FIG. 3 is an illustration of a manufacturing process of a TFT of the embodiment 1.

Also, of the regions to which phosphorus is not added in the addition process shown in FIG. 3(A), a region which overlaps the gate electrode 105 makes a second impurity region and a region which does not overlap the gate electrode 105 makes a third impurity region.

In this respect, the second impurity region and the third impurity region which are $n^-$ regions are lower in the concentration of phosphorus than the first impurity region ($n^+$ region).

Next, the photoresist masks 208, 209 are removed to form a photoresist mask 211 covering an n-channel type TFT.

Then, p-type impurities are added to the semiconductor layer 202 by using the gate electrode 105 as a mask. An ion implanting method or an ion doping method can be used as a method for adding the impurities. The p-type impurity is the one to be an acceptor and is a Group 15 element, more typically, boron (B) for silicon and germanium. The first impurity region ($p^+$ region) 212 is formed in this way (see FIG. 3(B)).

Figure 3B:
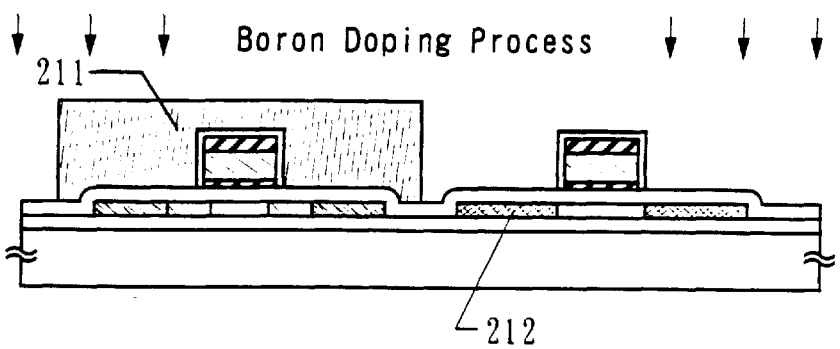
Figure 3C:
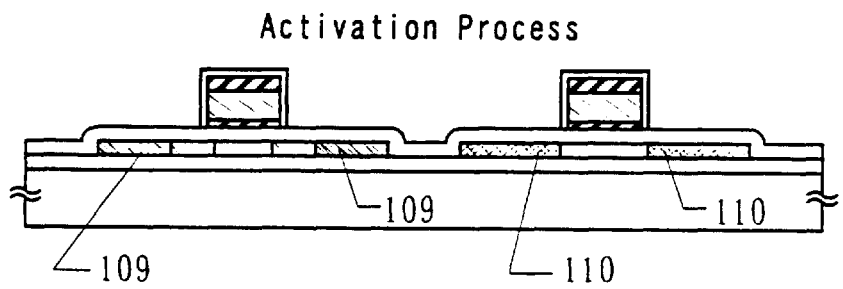

Next, an activation process for activating the added n-type impurities and p-type impurities is performed to form an activated first impurity region ($n^+$ region) 109 and an activated first impurity region ($p^+$ region) 110 (see FIG. 3(C)).

Next, in order to perform an oxidation process, the gate electrode connected in one wiring is separated by etching to form a gate wiring and a gate electrode in desired shapes.

Figure 3D:
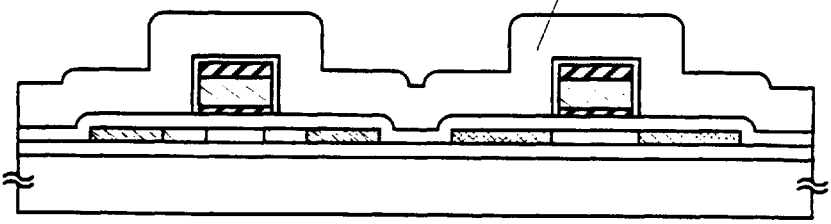

Next, an interlayer insulating film 111 made of a silicon oxide film is formed to cover the n-channel type TFT and the p-channel type TFT (see FIG. 3(D)).

Next, the gate insulating film 103 and the interlayer insulating film 111 are selectively etched to form contact holes extending to the first impurity regions 109, 110. Next, a source wiring (including a source electrode) 112 and 114, and a drain wiring (including a drain electrode) 113 are formed (see FIG. 3(E)). Lastly, the whole assembly is hydrogenated by a heat treatment in a hydrogen atmosphere to complete the n-channel type TFT and the p-channel type TFT.

In this respect, it is necessary to form a contact hole for bringing a gate wiring into contact with a leading-out electrode, and the top of the gate wiring in accordance with the present invention can easily be removed by a fluorine-base dry-etching because it is covered with the anodic oxide film of the third conductive layer (tantalum).

A thin film transistor in accordance with the present invention formed by the manufacturing method described above has two kinds of low-concentration impurity regions in the semiconductor layer, that is, a region which overlaps the gate electrode (the second impurity region) and a region which does not overlap the gate electrode (the third impurity region), and hence has reliability comparable to or higher than the MOSFET.

Advantages of the thin film transistor in accordance with the present invention are as described below.

A TFT in accordance with the present invention is characterized in that it has two kinds of low-concentration impurity regions (referred to as LDD regions), that is, the second impurity region (gate-overlapped LDD region) and the third impurity region (non-gate-overlapped LDD region), in the semiconductor layer.

The advantages of the TFT in accordance with the present invention will be described with reference to FIG. 12 in comparison with the characteristics of the conventional TFT.

Figure 12A:
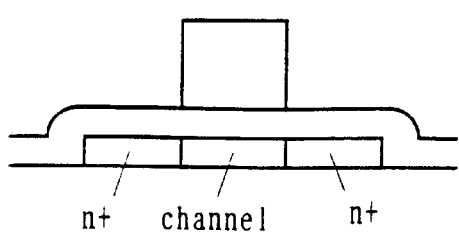
FIG. 12 is an illustration showing the electric characteristics of various kinds of TFT structures.
Figure 12B:
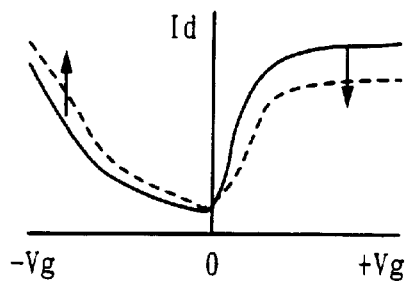
Figure 12C:
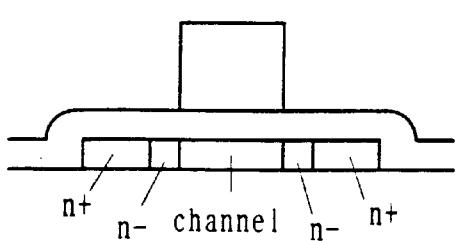
Figure 12D:
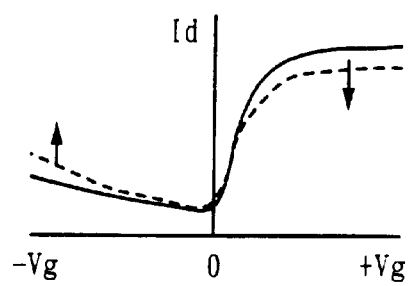

FIGS. 12(A), (B) show an n-channel type TFT having no LDD region and its electric characteristic (a gate voltage Vg vs. drain current Id characteristic). Similarly, FIGS. 12(C), (D) show an n-channel type TFT having an ordinary LDD structure and its electric characteristic, and FIGS. 12(E), (F) show an n-channel type TFT having a so-called GOLD structure and its electric characteristic, and FIGS. 12(G), (H) show an n-channel type TFT having a TFT in accordance with the present invention and its electric characteristic.

In this respect, in FIG. 12, $n^+$ designates a source region or a drain region, channel designates a channel forming region, $n^+$ designates a gate-overlapped LDD region ($n^+$ is the second impurity region), n designates a non-gate-overlapped LDD region (n is the third impurity region), Id designates a drain current, and Vg designates a gate voltage.

As shown in FIGS. 12(A), (B), in the case where the TFT has no LDD region, an off-current is high and hence an on-current (a drain current when a TFT is in an on-state) and the off-current are apt to deteriorate.

On the other hand, the off-current can considerably be reduced by forming a non-gate-overlapped LDD region and hence the on-current and the off-current can also be prevented from deteriorating. However, it does not mean that the on-current can completely be prevented from deteriorating (see FIG. 12 (C), (D)).

Figure 12E:
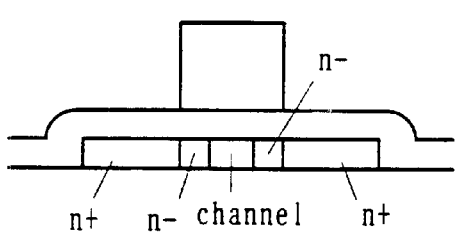
Figure 12F:
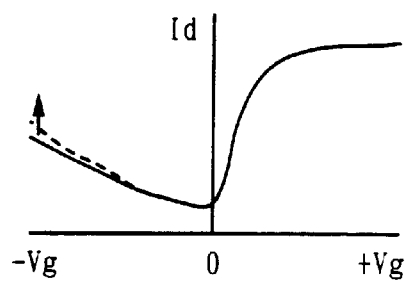

A TFT structure having only a gate-overlapped LDD structure in which an LDD region overlaps a gate electrode (see FIGS. 12(E), (F)) is the one placing emphasis on the prevention of the deterioration of the on-current in the conventional LDD structure.

This TFT structure can fully prevent the deterioration of the on-current, but it has a problem that it has an off-current slightly higher than an ordinary non-overlapped LDD structure. The paper described as the related art adopts this LDD structure. In recognition of the problem that the off-current is high in this TFT, the present invention has been made to overcome the problem.

Figure 12G:
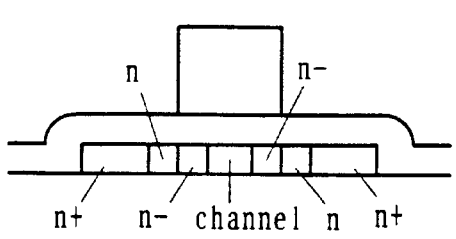
Figure 12H:
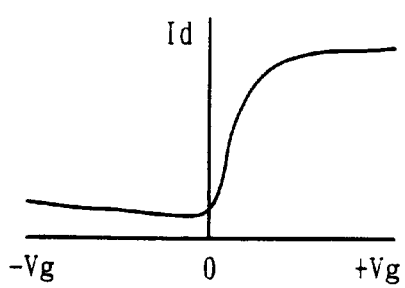
Figure 13A:
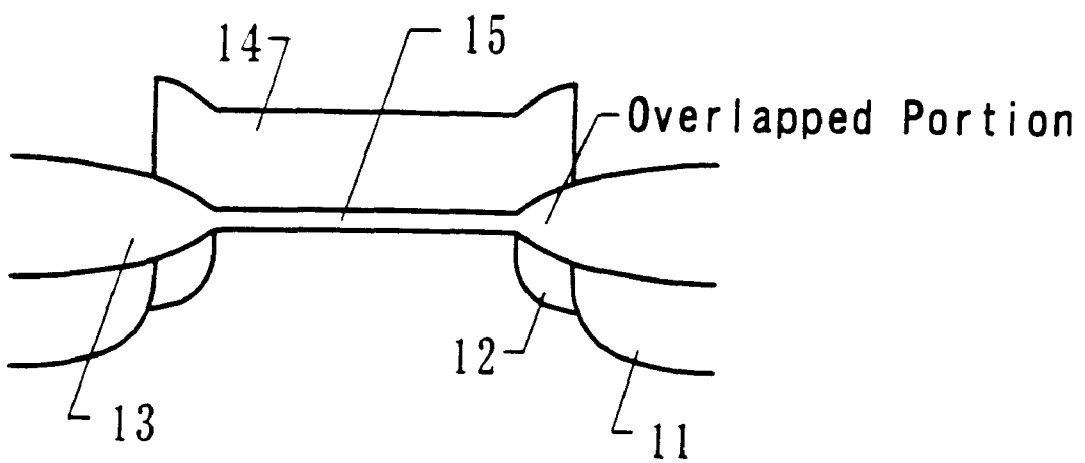
FIG. 13 is a schematic view of a conventional MOSFET.
Figure 13B:
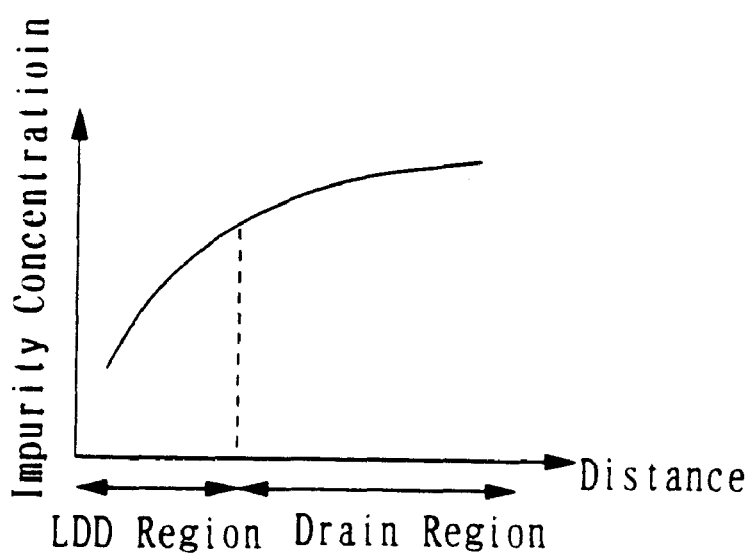

In the structure in accordance with the present invention, as shown in FIGS. 12(G), (H), an LDD region which overlaps a gate electrode (the second impurity region) and an LDD region which does not overlap the gate electrode (the third impurity region) were formed in the semiconductor layer. The adoption of this structure could reduce the off-current while keeping the effect of preventing the deterioration of the on-current.

As to why the off-current increased in the case of the structure shown in FIGS. 12(E), (F), the present applicant guessed as follows: when the n-channel type TFT is in an off-state, a negative voltage such as minus several tens of volts is applied to the gate electrode; if a positive voltage such as plus several tens of volts is applied to the drain region in this state, a very large electric field is formed at the end of the drain side of a gate insulating film; at this time, holes are induced in the LDD region to form a current path connecting the drain region, the LDD region, and the channel forming region by a small number of carriers; this current path increases the off-current.

The present applicant thought that it was necessary to form an other resistant body, that is, a third impurity region, at the position not overlapping the gate electrode. The present invention relates to a thin film transistor having a constitution like this and to a circuit using the thin film transistor.

PREFERRED EMBODIMENTS

The preferred embodiments in accordance with the present invention will hereinafter be described, and, of course, it is not intended to limit the present invention to the following preferred embodiments.

Embodiment 1

The preferred embodiment in accordance with the present invention will be described in detail with reference to FIG. 1 to FIG. 5.

One example of the structure of a semiconductor device provided with a semiconductor circuit including a semiconductor element utilizing the present invention will be described. The semiconductor device in accordance with the present invention has a peripheral driving circuit part and a pixel matrix circuit part on the same substrate. In order to easily show the preferred embodiment, a CMOS circuit constituting a part of the peripheral driving circuit part will be shown in FIG. 1, and a pixel TFT (n-channel type TFT) constituting a part of the pixel matrix circuit part will be shown in FIG. 4.

Figures 1B, 1C:
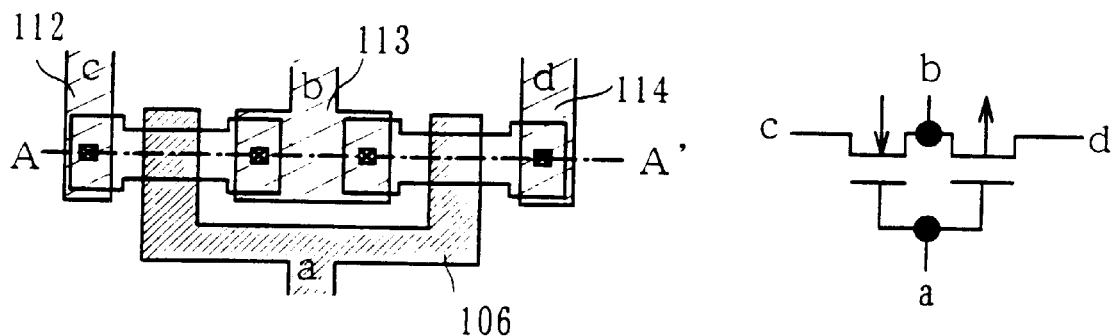

FIG. 1(B) is an illustration corresponding to the top plan view of FIG. 1(A), and a view taken on chain line A–A' in FIG. 1(B) corresponds to the cross-sectional structure of the CMOS circuit in FIG. 1(A). Also, FIG. 1(C) is a simplified circuit of the CMOS circuit.

In FIG. 1(A), both thin film transistors (TFT) are formed by patterning a semiconductor layer in a predetermined shape, wherein the semiconductor layer is made of a crystalline semiconductor film and is formed on an underlayer film 102 formed on a substrate 101.

An n-channel type TFT of the CMOS circuit includes, as a semiconductor layer, a channel forming region 104, an LDD region 108 adjacent to both sides of the channel forming region 104 (also, referred to as a low-concentration impurity region or an n⁻ region, in the present specification), and a first impurity region (n⁺ region) 109 adjacent to the LDD region 108. The first impurity region (n⁺ region) 109 functions as the source region or the drain region of the TFT. Further, a gate insulating film 103 is formed on the channel forming region 104 and a gate electrode 105 is formed on the gate insulating film 103 on the channel forming region 104. An anodic oxide film 107 is formed on the surface of the gate electrode 105 and an interlayer insulating film 111 is formed over the anodic oxide film 107. A source wiring 112 and a drain wiring 113 are connected to the n⁺ region 109. Still further, a passivation film (not shown) is formed over the interlayer insulating film 111.

As shown in FIG. 1(A), in the n-channel type TFT of the present preferred embodiment, all the LDD region 108 does not overlap the gate electrode 105 via the gate insulating film 103, but only a part of the LDD region 108 overlaps the gate electrode 105. In other words, the LDD region includes a part which overlaps the gate electrode (to which a gate voltage is applied) and a part which does not overlap the gate electrode 105 (to which the gate voltage is not applied).

Figure 1D:
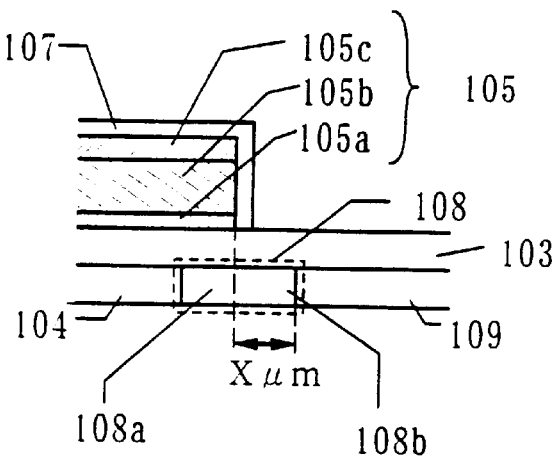

The constitution of this LDD region will be shown in FIG. 1(D). In this respect, reference symbols in FIG. 1(D) correspond to those in FIG. 1(A). As shown in FIG. 1(D), the LDD region 108 is divided into a part which overlaps the gate electrode 105 (gate-overlapped LDD region 108a) via the gate insulating film 103 and a part which does not overlap the gate electrode 105 (non-gate-overlapped LDD region 108b).

It is thought to be preferable in the present invention that the length of the gate-overlapped LDD region 108a is 0.1 µm to 2 µm (typically, 0.3 µm to 1.5 µm) and that the length of the non-gate-overlapped LDD region 108b is 0.1 µm to 2 µm (typically, 0.3 µm to 1 µm).

In this connection, the LDD region 108 has a length of 0.2 µm to 4µm (typically, 0.6 µm to 2.5 µm) and the concentration of an impurity (an element belonging to Group 15 of a periodic table, typically, phosphorus or arsenic) giving an n-type of $1 \times 10^{16}$ atoms/cm³ to $1 \times 10^{19}$ atoms/cm³, typically, $1 \times 10^{17}$ atoms/cm³ to $5 \times 10^{18}$ atoms/cm³. An impurity region containing impurity elements giving an n-type in a concentration of $1 \times 10^{16}$ atoms/cm³ to $1 \times 10^{19}$ atoms/cm³ is called an n⁻ region.

Also, it is recommended that the impurity concentration of the first impurity region (n⁺ region) 109 be $1 \times 10^{19}$ atoms/cm³ to $1 \times 10^{21}$ atoms/cm³, typically, $1 \times 10^{20}$ atoms/cm³ to $5 \times 10^{20}$ atoms/cm³. In the present specification, an impurity region containing impurity elements giving an n-type in a concentration of $1 \times 10^{19}$ atoms/cm³ to $1 \times 10^{21}$ atoms/cm³ is called an n⁺ region.

Also, the channel forming region 104 is made of an intrinsic semiconductor layer, or a semiconductor layer to which boron is previously added in a concentration of $1 \times 10^{16}$ atoms/cm³ to $5 \times 10^{18}$ atoms/cm³. The boron is added to control a threshold voltage and any other element may be used if it can produce the same effect.

On the other hand, in the case of a p-channel type TFT, a first impurity region (p⁺region) 110 and a channel forming region 100 are formed as a semiconductor layer. In the present specification, an impurity region containing impurity elements giving a p-type in a concentration of $1 \times 10^{19}$ atoms/cm³ to $1 \times 10^{21}$ atoms/cm³ is called a p⁺ region. In the p-channel type TFT, a low-concentration impurity region forming such an LDD structure is not formed. Of course, the low-concentration impurity region may be formed, but the p-channel type TFT inherently has high reliability and hence it is preferable to increase the on-current and to balance the p-channel type TFT with the n-channel type TFT in the characteristics. In particular, in the case where the p-channel type TFT is applied to a CMOS circuit, it is important to bring the characteristics into balance between them. However, the LDD structure may be applied to the p-channel type TFT with no trouble. Then, a source wiring 114 and a drain wiring 113 are connected to the p⁺ region. Further, a passivation film (not shown) made of a silicon nitride film is formed over them. The p-channel type TFT has the same structure as the n-channel type TFT except for the semiconductor layer and the wiring.

Figure 4A:
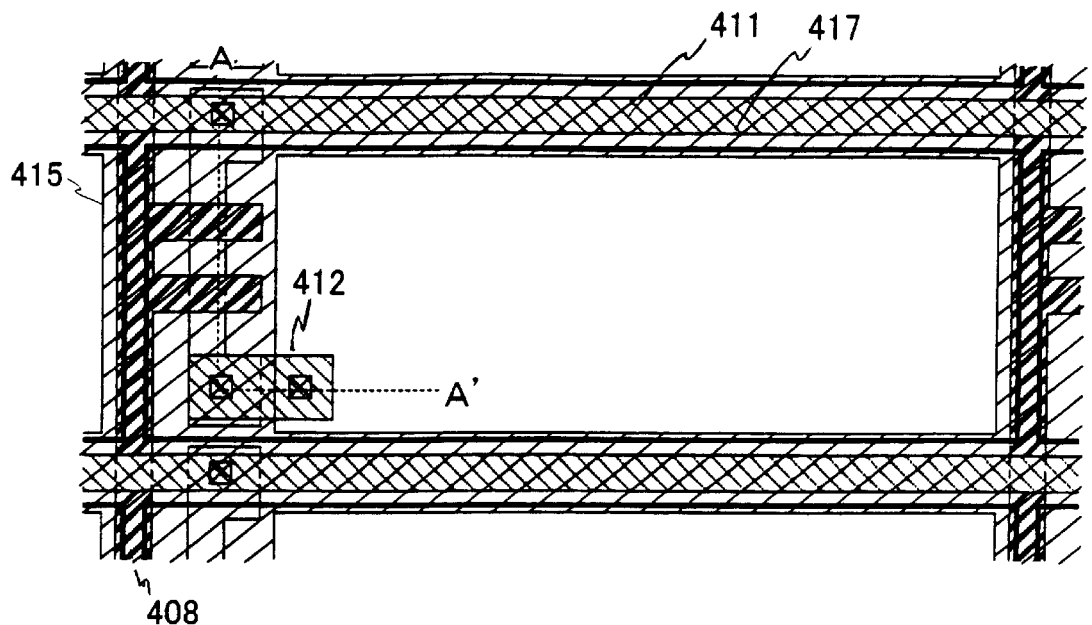
FIG. 4 is a plan view and a cross-sectional view of a pixel matrix circuit of the embodiment 1.
Figure 4B:
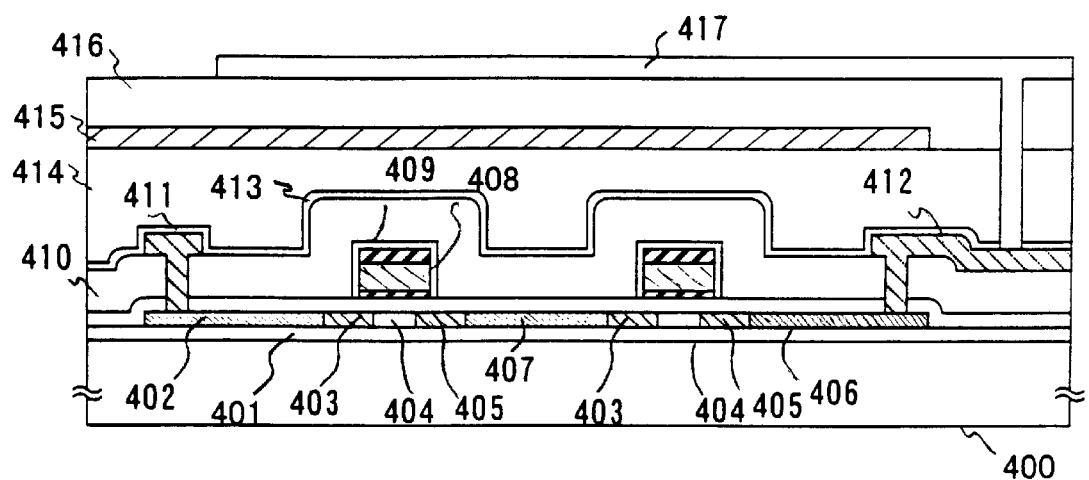

Also, FIG. 4(A) is an illustration corresponding to the top view of FIG. 4(B), and a view taken along chain line A–A' in FIG. 4(A) corresponds to a cross-sectional structure of a pixel matrix circuit in FIG. 4(B).

The n-channel type TFT formed in the pixel matrix circuit shown in each of FIG. 4(A) and FIG. 4(B) basically has the same structure as the n-channel type TFT of the CMOS circuit until an interlayer insulating film is formed. In this connection, an interlayer insulating film 410 in FIG. 4 corresponds to the interlayer insulating film 11 in FIG. 1A. In FIG. 4, a reference numeral 400 designates a substrate corresponding to the substrate 101, a numeral 401 designates an underlayer film corresponding to the underlayer film 102, numerals 402 and 406 each designate the first impurity region, a numeral 404 designates a channel forming region, numerals 403 and 405 each designate an LDD region, a numeral 408 designates a gate electrode corresponding to the gate electrode 105, and a numeral 409 designates an anodic oxide film corresponding to the anodic oxide film 107.

Then, wirings 411, 412 connected to the first impurity region are formed and a passivation film 413 is formed to cover them and then a second interlayer insulating film 414 and a black matrix 415 are formed thereon. Further, a third interlayer insulating film 416 is formed thereon and a pixel electrode 417 made of a transparent conductive film such as ITO, $SnO_2$, or the like is connected to the wiring 412. The black mask covers the pixel TFT and forms a pixel electrode and a retention capacitance.

While a transparent LCD has been described as an example in the present preferred embodiment, a reflective LCD can be manufactured if a reflective metal material is used as a material for the pixel electrode and the patterning of the pixel electrode is changed and some processes are added or omitted.

While the gate wiring of the pixel TFT of the pixel matrix circuit has a double gate structure, a multi-gate structure such as a triple gate structure may be used to reduce variations in the off-current. Further, in order to improve an aperture ratio, a single gate structure may be used.

As described above, the TFT in accordance with the present invention has the gate electrode having a three-layer structure, and as shown in FIG. 1(D), the gate electrode 105 is constituted by a three-layer film made of a first conductive layer 105a, a second conductive layer 105b, and a third conductive layer 105c.

The TFT in accordance with the present invention is characterized by the structure having two kinds of low-concentration impurity regions, that is, a region which overlaps the gate electrode (a second impurity region 108a) and a region which does not overlap the gate electrode (a third impurity region 108b), and is characterized by its manufacturing method.

A method of manufacturing a CMOS circuit will hereinafter be described with reference to FIG. 2, FIG. 3, and FIG. 5.

First, a nonalkali glass substrate, for example, a 1737 glass substrate made by Corning Corp., was prepared as a substrate 101. Then, an underlayer film 102 made of a silicon oxide film was formed to a thickness of 200 nm on the insulating surface of the substrate 101 where a TFT was to be formed.

Next, an amorphous silicon film 501 having a thickness of 50 nm was formed on the underlayer film 102 by a plasma CVD method (see FIG. 5(A)). The substrate 101 was subjected to a heat treatment at 500° C. for 2 hours in this preferred embodiment to reduce hydrogen content of the amorphous silicon film 501 to 5 atomic % or less. In this respect, the conditions of the heat treatment depend on a hydrogen content of the formed amorphous silicon film.

Next, the amorphous silicon film 503 was subjected to a crystallization treatment to form a crystalline silicon film 505. In this preferred embodiment, pulse oscillation type KrF excimer laser light was converged in a line and was applied to the amorphous silicon film 503 to form the crystalline silicon film 505 (see FIG. 5(B)).

The crystalline silicon film 505 formed in this way was patterned to form island-shaped semiconductor layers (also called an active layer) 201, 202.

Next, a gate insulating film 103 was formed to cover the semiconductor layers 201, 202. In the present preferred embodiment, a silicon nitride oxide film having a thickness of 100 nm was formed by a plasma CVD method (see FIG. 2(A)).

Next, a photoresist film was patterned to form a photoresist mask 204 covering a region where a p-channel type TFT was to be formed and a photoresist mask 203 covering a part of an n-channel type TFT, and impurities transforming the semiconductor layer 201 into an n-type semiconductor were added to the semiconductor layer 201 by using the photoresist masks 203, 204 as masks. In this preferred embodiment, phosphorus was used as the impurities for transforming the semiconductor layer 201 into an n-type semiconductor, and the impurities were added to the semiconductor layer 201 through a gate insulating film by an ion doping method using phosphine(PH$_3$). An impurity region 205 formed in this way is to form an LDD region 108 of an n-channel type TFT, which is described in FIG. 3(A) below.

The phosphorus concentration of this region was set at $1 \times 10^{18}$ atoms/cm$^3$ in the present preferred embodiment.

Also, phosphorus was not added to a region just under the photoresist mask 203 and the channel forming region of an n-channel type TFT was defined by the photoresist mask 203 (see FIG. 2(B)).

Next, the photoresist masks 203, 204 were removed and then the substrate was subjected to an activation treatment to form an activated impurity region 200 (see FIG. 2(C)). Impurity elements added to the semiconductor layer were required to be activated by a laser annealing method or a heat treatment. This activation treatment may be performed after the addition of impurity for forming a source region and a drain region, but the activation of the impurities by a heat treatment at this step was effective.

Although not shown, a laminated film having a three-layer structure of a first conductive film/a second conductive film/a third conductive film was formed in a thickness of 100 nm to 1000 nm. In the present preferred embodiment, the laminated film was made of tantalum (film thickness: 20 nm)/aluminum (film thickness: 200 nm)/tantalum (film thickness: 100 nm). In this respect, it is recommended that the thickness of the first conductive film be 5 nm to 50 nm, the thickness of the second conductive film be 5 nm to 300 nm, and the thickness of the third conductive film be 5 nm to 300 nm.

Then, a gate electrode 206 having a three-layer structure of a first conductive film 206a/a second conductive film 206b/a third conductive film 206c was formed by a publicly known patterning technology such that it overlapped an n$^-$ region via the gate insulating film (see FIG. 2(D)). At this time, all the three-layered films of the gate electrode 206 were connected to each other for the following anodic oxidation process. In this respect, although not shown, when a gate wiring was patterned by dry-etching, the gate insulating film was slightly etched, too.

Next, a dense anodic oxide film 107 was formed on the surface of the gate electrode 105 (105a, 105b, 105c) by an anodic oxidation method (see FIG. 2(E)). The anodic oxidation process was performed by using an electrolytic solution (solution temperature: 10° C.) made by neutralizing an ethylene glycol solution containing 3% tartaric acid with an aqueous ammonia and by using a gate wiring as an anode and platinum as a cathode. In this connection, while the anodic oxide film 107 is shown as a single layer for simplification in FIG. 2(E), actually, an anodic oxide film made of aluminum was formed on the side of the second conductive layer, an anodic oxide film made of tantalum was formed on the top and the side of the third conductive layer, and an anodic oxide film made of tantalum was formed on the side of the first conductive layer. However, in order to avoid the form action of an oxide film on the top of the second conductive film, it is necessary to control the conditions of the anodic oxidation process suitably such that, even if the anodic oxidation process is performed, the third conductive layer remains.

Next, a photoresist mask was patterned to form a photoresist mask 209 covering a region where a p-channel type TFT was to be formed and a photoresist mask 208 covering a part of an n-channel type TFT, and the second addition of impurities to the semiconductor layer for transforming the semiconductor layer into an n-type semiconductor was performed by using the photoresist masks 208, 209. Here, as is the case with the addition process described above, phosphorus was added to the semiconductor layer under the gate insulating film through the gate insulating film. A first impurity region 210 formed in this manner formed the source region or the drain region of an n-channel type TFT, which will be described below. A phosphorus concentration of the region was set to $5 \times 10^{20}$ atoms/cm$^3$.

In this manner, the first impurity region 210 and the LDD region 108 were defined by using the photoresist mask 208 (see FIG. 3(A)).

Next, the photoresist masks 208, 209 were removed and then a photoresist mask was patterned to form a photoresist mask 211 covering a region where an n-channel type TFT was formed and impurities transforming the semiconductor layer into a p-type semiconductor were added only to a semiconductor layer 202 by using the gate electrode as a mask. In the present preferred embodiment, boron (B) was used as the impurity transforming the semiconductor layer into a p-type semiconductor and the impurities were added to the semiconductor layer 202 through the gate insulating film by an ion doping method using diborane ($B_2H_6$). A first impurity region 212 formed in this manner made the source region or the drain region of a p-channel type TFT described below. A boron concentration of the region was set to $5 \times 10^{20}$ atoms/cm$^3$.

Also, the boron was not added to a region just under the gate electrode and the channel forming region 100 of a p-channel type TFT was defined (see FIG. 3(B)).

Although the addition of impurities for forming a p$^+$ region was performed after the addition of impurities for forming a n$^+$ region was performed, the addition of impurities for forming a n$_+$ region may be performed after the addition of impurities for forming a p$^+$ region is performed.

Next, the photoresist mask 211 was removed and then an activation process for activating the impurities added to the semiconductor layer was performed to effectively transform the semiconductor layer into an n-type or a p-type semiconductor (see FIG. 3(C)). In the present preferred embodiment, a heat treatment was performed in a nitrogen atmosphere at 500° C. for 2 hours to activate the impurities. In the present preferred embodiment, aluminum was used for the second conductive layer constituting the gate electrode, but the second conductive layer was sandwiched between the first conductive layer and the third conductive layer and the side of the second conductive layer was covered with the dense anodic oxide film. Therefore, the occurrence of hillocks and the diffusion of the aluminum element into the other region could be prevented.

Next, in order to perform the anodic oxidation process, a gate wiring connected in one wiring was cut by etching to form the gate wiring and the gate electrode in the desired shapes.

Next, an interlayer insulating film 111 was formed to a thickness of 1 μm. In the present preferred embodiment, although not shown, a silicon nitride film was first formed to a thickness of 50 nm and then a silicon oxide film was formed to a thickness of 950 nm to form a two-layer structure (see FIG. 3(D)).

After the interlayer insulating film 111 was formed, contact holes extending to the first impurity regions (a source region or a drain region) 109, 110 of both TFTs were formed by patterning. By the process identical to this process of forming the contact holes or by a process different from this process, contact holes (not shown) for connecting the gate wiring to an upper layer wiring (not shown) were formed. Then, source wirings (or source electrodes) 112, 114, a drain wiring (or a drain electrode) 113, and an upper layer wiring (not shown) were formed. In the present preferred embodiment, although not shown, the wirings 112 to 114 were formed by patterning a three-layer film made of a titanium film (film thickness: 100 nm), an aluminum film containing titanium (film thickness: 300 nm), and a titanium film (film thickness: 150 nm), these three films being formed in sequence by a sputtering method (see FIG. 3(E)).

Next, the substrate was subjected to a heat treatment in a hydrogen atmosphere to hydrogenate the whole. In this step, a CMOS circuit (an n-channel type TFT and a p-channel type TFT) shown in FIG. 1(A) was completed.

Figure 3E:
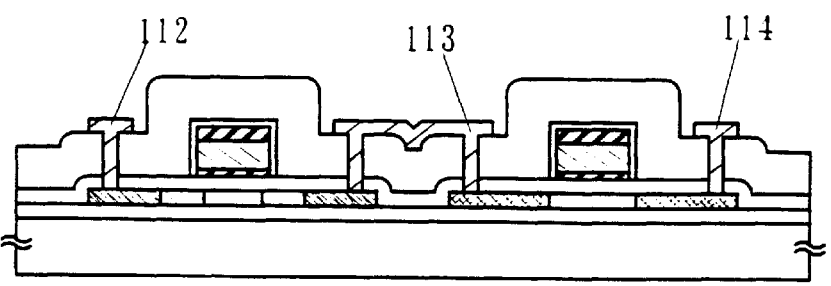

Accordingly, after the state shown in FIG. 3(E) was formed, a passivation film (a silicon nitride film) 413 was formed to a thickness of 0.2 μm to 0.4 μm. After the passivation film was formed, a second interlayer insulating film 414 made of an organic resin was formed to a thickness of about 2 μm. In the present preferred embodiment, polyimide of the type thermally polymerized was applied to the substrate as the organic resin and then was baked to 300° C. to form the second interlayer insulating film 414.

Then, a black mask 415 was formed of a titanium film and then a third interlayer insulating film 416 was formed thereon. Then, the second interlayer insulating film 414 and the third interlayer insulating film 416 were selectively etched to form a contact hole extending to the drain wiring 412 and to form a pixel electrode 417. In this manner, a pixel matrix circuit was completed.

After the state shown in FIG. 4(B) was completed, an oriented film (made of polyimide in the present preferred embodiment) was formed. A transparent conductive film and an oriented film were formed on a substrate opposite thereto. After the oriented films were formed, they were subjected to a rubbing treatment to make liquid crystal molecules orient in parallel to each other at a given pre-tilted angle.

After the processes described above were finished, the substrate on which the pixel matrix circuit and the CMOS circuit were formed was bonded to the opposite substrate via a sealing material and a spacer by a publicly known cell assembling process. Then, a liquid crystal material was injected into a gap between both the substrates and then the gap was completely sealed with a sealing agent. In this manner, a liquid crystal panel was completed.

Embodiment 2

In the embodiment 2, an example will be described in which a crystalline semiconductor film used as semiconductor layers 201, 202 in the embodiment 1 is formed by a thermal crystallization method using a catalytic element. In the case of using a catalytic element, it is preferable to use technologies disclosed in Japanese Patent Laid-Open No. 7-130652 and Japanese Patent Laid-Open No. 8-78329.

Here, an example will be described in FIG. 6 in which the technology disclosed in Japanese Patent Laid-Open No. 7-130652 is applied to the present invention. First, a silicon oxide film 602 was formed on a substrate 601 and then an amorphous silicon film 603 was formed thereon. Further, a nickel acetate solution containing 10 ppm by weight of nickel was applied thereon to form a nickel-containing layer 604 (see FIG. 6(A)).

Next, the substrate was subjected to dehydrogenation at 500° C. for one hour and then was subjected to a heat treatment at 550° C. to 650° C. for 4 hours to 24 hours (in the present preferred embodiment, at 550° C. for 14 hours) to form a crystalline silicon film 605. The crystal line silicon film 605 formed in this manner (also, called polysilicon) had a very excellent crystalline property (see FIG. 6(B)).

Also, the technology disclosed in Japanese Patent Laid-Open No. 8-78329 makes it possible to crystallize an amorphous semiconductor film selectively by adding a catalytic element selectively. An example in which this technology was applied to the present invention will be described with reference to FIG. 7.

First, a silicon oxide film 702 was formed on a glass substrate 701 and then an amorphous silicon film 703 and a silicon oxide film 704 were formed in sequence thereon.

Next, the silicon oxide film 704 was patterned to form apertures 705 selectively and then a nickel acetate solution containing 10 ppm by weight of nickel was applied thereon to form a nickel-containing layer 706 and the nickel containing layer 706 was brought into contact with the amorphous silicon film 702 only at the bottom of the aperture 705 (see FIG. 7(A)).

Next, the substrate was subjected to a heat treatment at 500° C. to 650° C. for 4 hours to 24 hours (in the present preferred embodiment, at 580° C. for 14 hours) to form a crystalline silicon film 707. In this crystallization process, a part of the amorphous silicon film 707 in contact with nickel was first crystallized and then crystallization proceeded in the lateral direction. The crystalline silicon film 707 formed in this way formed a crystalline texture including bar-shaped or needle-shaped crystals and each crystal thereof grew macroscopically in a specific direction and hence was uniform in crystalline property, which is an advantage of this crystalline silicon film 707.

In this respect, in the two technologies described above, the following catalytic elements may be used in addition to nickel (Ni): germanium (Ge), iron (Fe), palladium (Pd), tin (Sn), lead (Pb), cobalt (Co), platinum (Pt), copper (Cu), and gold (Au).

The semiconductor layer of the TFT can be formed by forming a crystalline semiconductor film (including a crystalline silicon film, a crystalline silicon germanium film, or the like) and then by patterning it. The TFT made of a crystalline semiconductor film by using the technology of the present preferred embodiment can produce an excellent characteristic and hence has been required to be of high reliability. However, the adoption of the TFT structure in accordance with the present invention can produce a TFT making the most use of the technology of the present preferred embodiment.

Embodiment 3

In the embodiment 3, a method in which a crystalline semiconductor film was formed by using an amorphous semiconductor film as a starting film, as is the case with the embodiment 2, and by using the above described catalytic element and then the catalytic element was removed from the crystalline semiconductor film, will be described as a method of forming the semiconductor layers 201, 203 used in the embodiment 1. In the present preferred embodiment 3, the technologies disclosed in Japanese Patent Laid-Open No. 10-135468 or Japanese Patent Laid-Open No. 10-135469 were used as the method.

The technology disclosed in the above references is the one removing a catalytic element used for the crystallization of an amorphous semiconductor film by the gettering action of phosphorus after the crystallization. The concentration of the catalytic element in the crystalline semiconductor film can be reduced to $1\times10^{17}$ atoms/cm$^3$ or less, more preferably, $1\times10^{16}$ atoms/cm$^3$ or less, by using this technology.

Figure 8A:
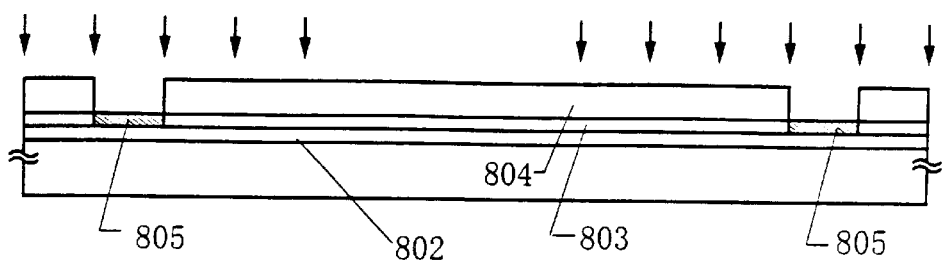
FIG. 8 is an illustration, in the cross-section of a substrate, of a gettering process of the embodiment 3.
Figure 8B:
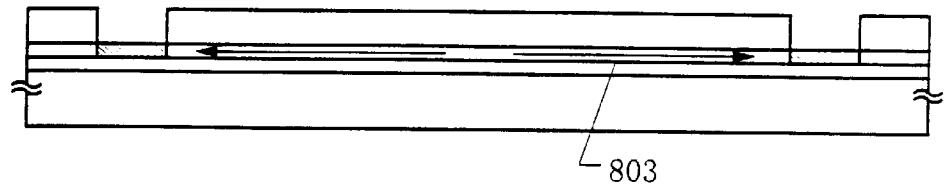

The constitution of the present preferred embodiment 3 will be described with reference to FIG. 8. Here, a nonalkali glass substrate, typically, a 1737 substrate made by Corning Corp., was used. FIG. 8(A) shows a state in which an underlayer film 802 and a crystalline silicon film 803 were formed by using the technology of crystallization described in the embodiment 2. Then, a silicon oxide film 804 for masking was formed on the surface of the crystalline silicon film 803 to a thickness of 150 nm and then apertures were formed by patterning to form regions exposing the crystalline silicon film 803. Then, a phosphorus addition process was performed to form the regions 805 to which phosphorus was added in the crystalline silicon film 803.

The substrate in this state was subjected to a heat treatment in a nitrogen atmosphere at 550° C. to 800° C. for 5 hours to 24 hours (in the embodiment 3, at 600° C. for 12 hours), whereby the region 805 to which the phosphorus was added acted on the crystalline silicon film 803 as a gettering site to move catalytic elements remaining in the crystalline silicon film 803 to the regions 805 to which the phosphorus was added.

Then, the silicon oxide film 804 for masking and the region 805 to which the phosphorus was added were removed by etching to form a crystalline silicon film in which the concentration of the catalytic element used in the crystallization process was reduced to $1\times10^{17}$ atoms/cm$^3$ or less. This crystalline silicon film could be used as it, was as the semiconductor layer of the TFT in accordance with the present invention described in the embodiment 1.

Embodiment 4

In the embodiment 4, the other preferred embodiment for forming the semiconductor layers 201, 202 and the gate insulating film 103 in the process for forming the TFT in accordance with the present invention described in the embodiment 1 will be described.

Figure 9A:
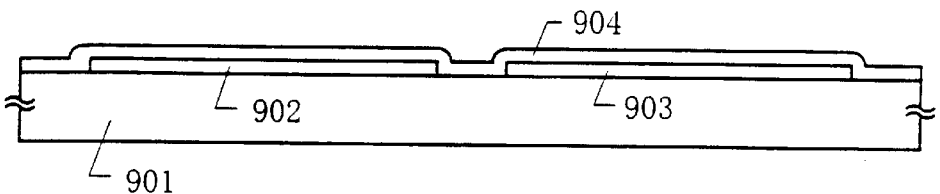
FIG. 9 is an illustration, in the cross-section of a substrate, of a gettering process of the embodiment 4.

Here, a substrate needed to have a heat resistance up to about 700° C. to 1100° C. and a quartz substrate was used. Then, a crystalline semiconductor film was formed by using the technology described in the embodiments 2, 3 and then was patterned into an island shape to make the active layer of the TFT, whereby semiconductor layers 902, 903 were formed. Then, a gate insulating film 904 covering the semiconductor layers 902, 903 was formed of the film whose main constituent was silicon oxide. In the present preferred embodiment 4, a silicon nitride oxide film was formed to a thickness of 70 nm by a plasma CVD method (see FIG. 9(A)).

Figure 9B:
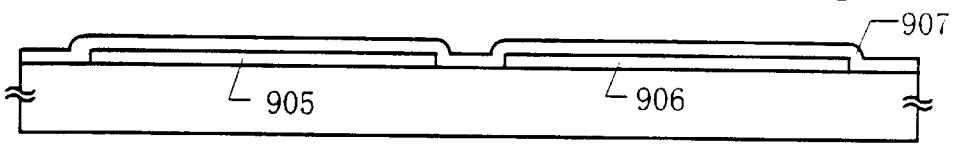

Then, the substrate was subjected to a heat treatment in an atmosphere containing halogen (typically, chlorine) and oxygen at 950° C. for 30 minutes in the present preferred embodiment 4. In this respect, a treatment temperature might be selected in a range of 700° C. to 100° C. and a treatment time might be selected in a range of 10 minutes to 8 hours (see FIG. 9(B)).

As a result, under the conditions of the present embodiment 4, a thermal oxide film was formed at an interface between the semiconductor layers 902, 903 and the gate insulating film 904 and a gate insulating 907 was formed.

The gate insulating film 907 formed by the processes described above had a high insulation voltage and an interface between the semiconductor layers 905, 906 and the gate insulating film 907 was very good. In order to produce a TFT in accordance with the present invention, the same processes used in the preferred embodiment 1 may be used in the following processes.

It is needless to say that, if necessary, a person putting the present invention into practice can combine the present embodiment 4 with the embodiment 2 or the embodiment 3.

Embodiment 5

Figure 10:
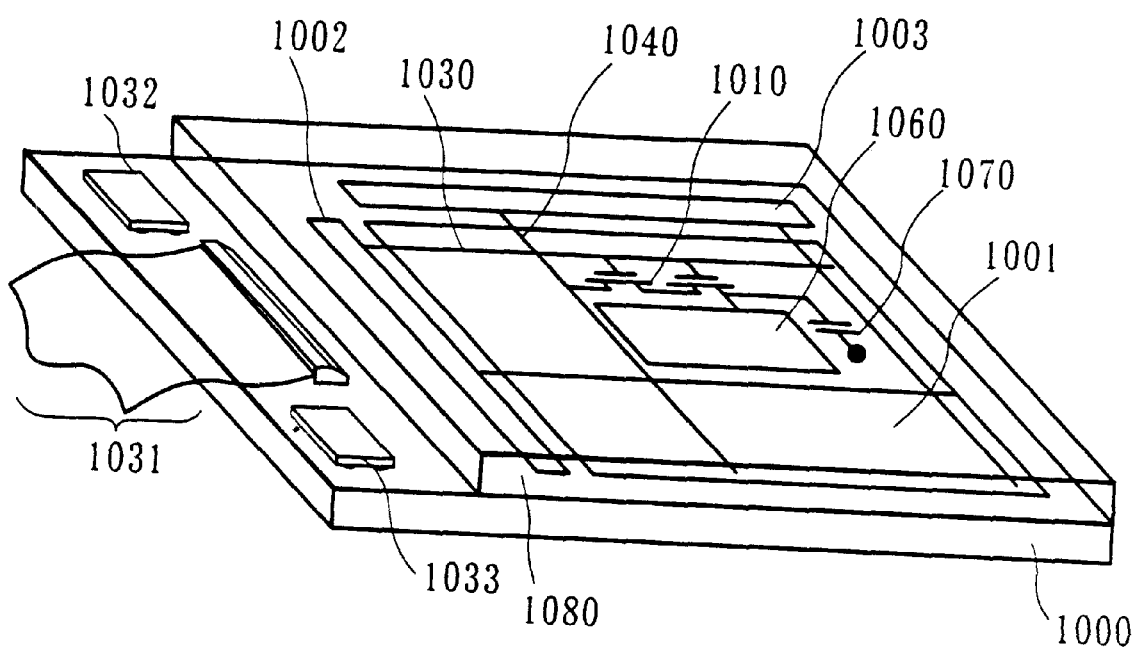
FIG. 10 is an illustration showing the constitution of an active matrix substrate of the embodiment 5.

In the present embodiment 5, an example of a liquid crystal manufactured by the present invention will be shown in FIG. 10. Since publicly known means may be used for manufacturing a pixel TFT (pixel switching device) and for assembling a cell, detailed description therefore will be omitted.

FIG. 10 is a schematic view of an active matrix type liquid crystal panel in accordance with the present invention. As shown in FIG. 10, an active matrix substrate is opposed to an opposite substrate and liquid crystal is sandwiched between these substrates. The active matrix substrate has a pixel matrix circuit 1001, a scanning line driving circuit 1002, and a signal line driving circuit 1003 formed on a glass substrate 1000.

The scanning line driving circuit 1002 and the signal line driving circuit 1003 are connected to the pixel matrix circuit 1001 by a scanning line 1030 and a signal line 1040, respectively. The scanning line driving circuit 1002 and the signal line driving circuit 1003 are mainly constituted by CMOS circuits.

The scanning line 1030 is formed for every column of the pixel matrix circuit 1001, and the signal line 1040 is formed for every row thereof. A pixel TFT1010 is formed in the vicinity of the intersection of the scanning line 1030 and the signal line 1040. The gate electrode of the pixel TFT 1010 is connected to the scanning line 1030, and the source thereof is connected to the signal line 1040. Further, a pixel electrode 1060 and a retention capacitance 1070 are connected to the drain of the pixel TFT 1010.

The opposite substrate 1080 has a transparent conductive film made of an ITO film or the like on the whole surface of a glass substrate. The transparent conductive film is an opposite electrode to the pixel electrode 1060 of the pixel matrix circuit 1001 and a liquid crystal material is driven by an electric field formed between the pixel electrode 1060 and the opposite electrode. If necessary, an oriented film, a black matrix, and a color filter are formed on the opposite substrate 1080.

IC chips 1032, 1033 are mounted on the surface on which an FPC 1031 is mounted of the glass substrate of the active matrix substrate side. These IC chips 1032, 1033 are constituted by circuits formed on a silicon substrate, such as a video signal processing circuit, a timing pulse generating circuit, a γ-correction circuit, a memory circuit, an arithmetic circuit, and the like.

Further, although a liquid crystal display device has been described as an example in the present preferred embodiment 5, it is needless to say that the present invention can be applied to an electroluminescence (EL) display device and an electrochromic (EC) display device, in case of active matrix type display devices.

Also, the present invention can be applied to a transparent type liquid crystal display device and a reflection type liquid crystal display device. A person putting the present invention into practice has freedom to choose the type of the liquid crystal display device. In this manner, the present invention can be applied to all active matrix type electrooptical devices (semiconductor devices).

In this respect, any constitution of the embodiments 1 to 4 may be adopted and the preferred embodiments can freely be combined with each other to manufacture a semiconductor device described in the present embodiment.

Embodiment 6

The present invention can be applied to the conventional IC technologies in general, in other words, to all commercially available semiconductor circuits. For example, the present invention may be applied to a microprocessor (such as a RISC processor integrated on one chip, an ASIC processor, or the like), a signal processing circuit typified by a driver circuit for liquid crystal (a D/A converter, a γ correction circuit, a signal split circuit, or the like), and a high-frequency circuit for a potable device (a cellular phone, a PHS, a mobile computer).

Further, it is also possible to realize a semiconductor having a three-dimensional structure which is manufactured by forming an interlayer insulating film on a conventional MOSFET and then by fabricating a semiconductor circuit on the interlayer insulating film by using the present invention. In this manner, the present invention can be applied to all present semiconductor devices mounted with an LSI. In other words, the present invention may be applied to an SOI structure (TFT structure using a single crystal semiconductor thin film) such as an SIMOX, an Smart-Cut (a trademark of SOITEC Corp.), an ELTRAN (a trademark of Canon Corp.), or the like., Also, a semiconductor circuit such as a microprocessor or the like is mounted in various kinds of electronic devices and functions as a center circuit thereof. As typical electronic devices may be mentioned a personal computer, a personal digital assistant, and various kinds of household electric appliances, a computer for controlling a vehicle (an automobile, an electric train, or the like), and the like. The present invention can be applied to the semiconductor devices mounted in these electronic devices.

In this respect, to manufacture the semiconductor device described in the present embodiment 6, any constitution of the embodiments 1 to 5 may be used and the preferred embodiments can freely be combined with each other.

Embodiment 7

An electrooptical device (semiconductor device) in accordance with the present invention is used as a display device or a liquid crystal display device in various kinds of electronic devices. As such electronic devices may be mentioned a video camera, a digital camera, a projector, a projection TV, a goggle display, a car navigator, a personal computer, a personal digital assistant (a mobile computer, a cellular phone, a digital book, or the like), and the like. Examples of these electronic devices will be shown in FIG. 11.

Figure 11A:
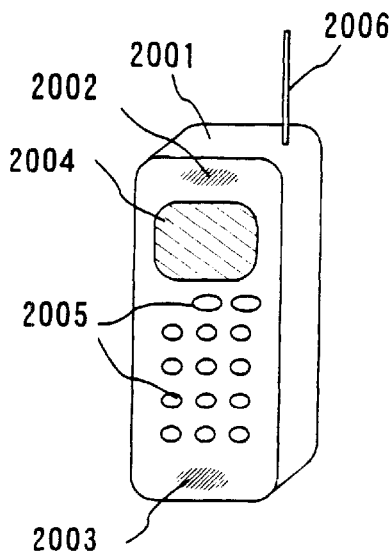
FIG. 11 is an illustration showing an electronic device of the embodiment 7.

FIG. 11(A) is an illustration of a cellular phone including a main body 2001, a voice output part 2002, a voice input part 2003, a display device 2004, an operation switch 2005, and an antenna 2006. The present invention can be applied to the voice output part 2002, the voice input part 2003, the display device 2004, and the other signal control circuit.

Figure 11B:
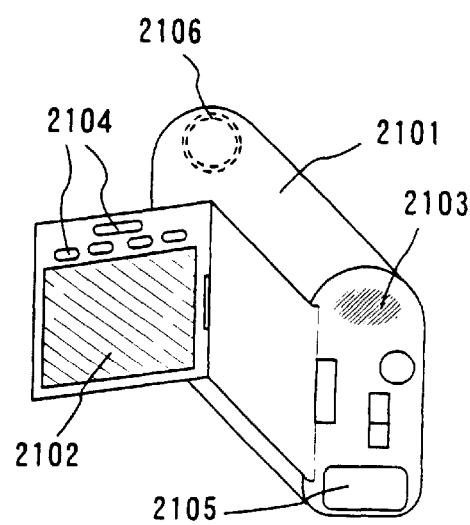

FIG. 11(B) is an illustration of a video camera including a main body 2101, a display part 2102, a voice input part 2103, an operation switch 2104, a battery 2105, and an image receiving part 2106. The present invention can be applied to the display part 2102, the voice input part 2103, and the other signal control circuit.

Figure 11C:
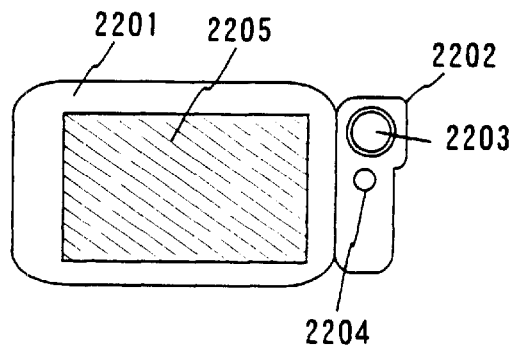

FIG. 11(C) is an illustration of a mobile computer including a main body 2201, a camera part 2202, an image receiving part 2203, an operation switch 2204, and a display part 2205. The present invention can be applied to the display part 2205 and the other signal control circuit.

Figure 11D:
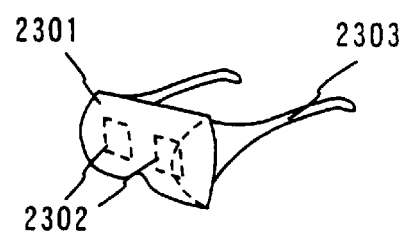

FIG. 11(D) is an illustration of a goggle display including a main body 2301, a display part 2302, and an arm part 2303. The present invention can be applied to the display part 2302 and the other signal control circuit.

Figure 11E:
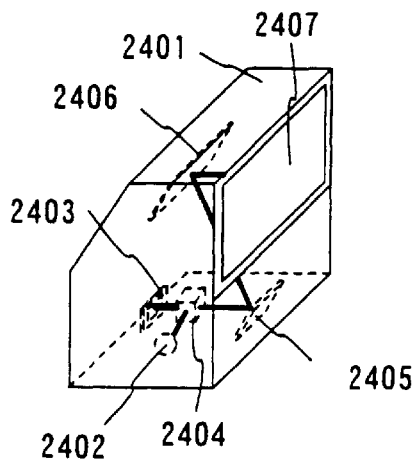

FIG. 11(E) is an illustration of a player using recording media recording a program (hereinafter referred to as recording media) including a main body 2401, a display part 2402, a speaker part 2403, a recording medium 2404, and an operation switch 2405. In this respect, the player uses a DVD (Digital Versatile Disc) and a CD as the recording medium and can be used for a music appreciation, a movie appreciation, a game, and an Internet. The present invention can be applied to the display part 2402 and the other signal control circuit.

Figure 11F:
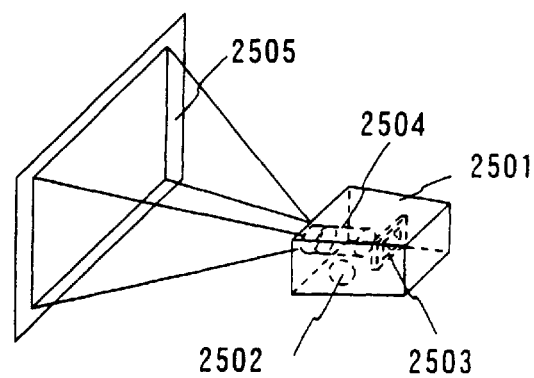

FIG. 11(F) is an illustration of a digital camera including a main body 2501, a display part 2502, an eyepiece 2503, an operation switch 2504, and an image receiving part (not shown). The present invention can be applied to the display part 2502 and the other signal control circuit.

Figure 14A:
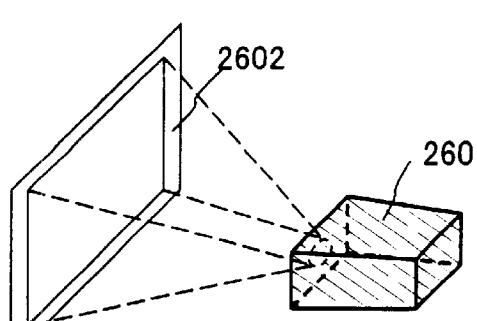
FIG. 14 is an illustration showing an electronic device of the preferred embodiment 7.

FIG. 14(A) is an illustration of a front type projector including a projector unit 2601 and a screen 2602. The present invention can be applied to the projector unit 2601 and the other signal control circuit.

Figure 14B:
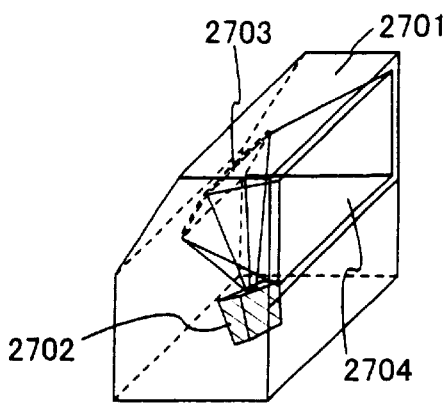

FIG. 14(B) is an illustration of a rear type projector including a main body 2701, a projector unit 2702, a mirror 2703 and a screen 2704. The present invention can be applied to the projector unit 2702 and the other signal control circuit.

Figure 14C:
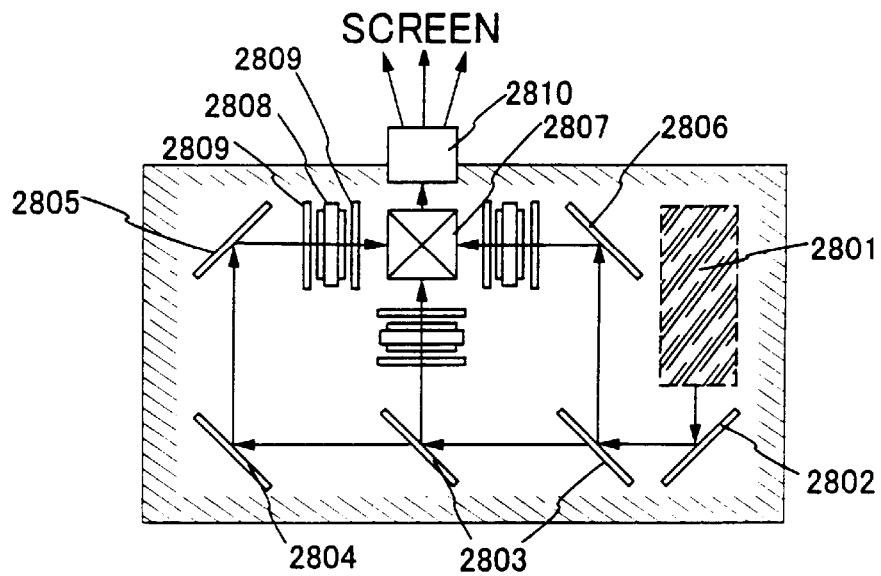

In this respect, FIG. 14(C) is an illustration of the structure of the projection units 2601, 2702 in FIG. 14(A) and FIG. 14(B). The projection units 2601, 2702 each include a light source optical system 2801, mirrors 2802, 2804 to 2806, a dichroic mirror 2803, a prism 2807, a liquid crystal display device 2808, a phase-contrast plate 2809, and a projection optical system 2810. The projection optical system 2810 is constituted by an optical system including a projection lens. While the present preferred embodiment shows an example of a three-plate type projector, it is not intended to limit the present invention to this type, but the present invention can be applied to a single plate type projector. Further, a person putting the present invention into practice may arrange an optical system such as an optical lens, a film having a polarizing function, a film controlling a phase difference, an IR film, and the like, in an optical path designated by an arrow in FIG. 14(C).

Figure 14D:
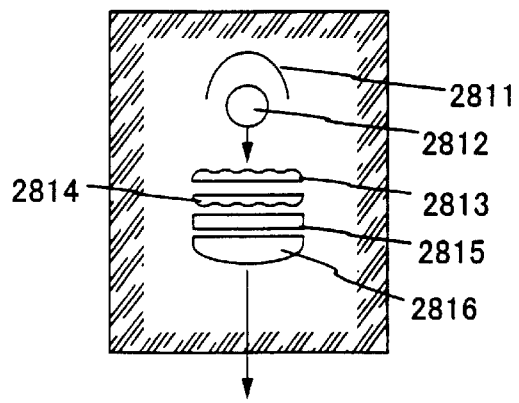

Also, FIG. 14(D) is an illustration of the structure of the light source optical system 2801 in FIG. 14(C). In the present preferred embodiment, the light source optical system 2801 is constituted by a reflector 2811, light sources 2812, 2813, 2814, a polarization transforming device 2815, and a converging lens 2816. In this respect, the light source optical system 2801 shown in FIG. 14(D) is an example, and it is not intended to limit the present invention to this light source optical system. For example, a person putting the present invention into practice may arrange an optical system such as an optical lens, a film having a polarizing function, a film controlling a phase difference, an IR film, and the like, in the light source optical system.

As described above, the scope of application of the present invention is extremely wide and includes the electronic devices in all fields.

In this respect, to manufacture the semiconductor device described in the present preferred embodiment, any constitution of the preferred embodiments 1 to 4 may be adopted and each preferred embodiment can freely be combined with each other. Also, the electrooptical devices and the semiconductor circuits described in the embodiments 5, 6 may be combined in the like manner.

Effects of the Invention

The use of the present invention can improve the reliability of an n-channel type TFT used for all kinds of semiconductor devices. As a result, the present invention can improve the reliability of a semiconductor device including a CMOS circuit made of the TFT, to be more specific, the reliability of the pixel matrix circuit of a liquid crystal display device and a driving circuit mounted in the peripheral portion thereof. Additionally, this can improve the reliability of an electronic device in which a semiconductor circuit including the n-channel type TFT and the liquid crystal display device described above are mounted as parts.

What is claimed is:

1. A method for manufacturing a semiconductor device comprising the steps of:

forming a semiconductor film over a substrate;

forming a gate insulating film over said semiconductor film;

forming a mask over said gate insulating film;

forming impurity regions in said semiconductor film by introducing an impurity element by using said mask;

removing said mask;

forming a gate electrode over said gate insulating film so that said gate electrode partially overlaps said impurity regions; and annealing said semiconductor film so that said impurity element therein is activated, wherein said gate electrode comprises a multilayer film including in consequence a first conductive layer, a second conductive layer and a third conductive layer, wherein said second conductive layer comprises aluminum.

2. A method according to claim 1, wherein said first conductive layer comprises tantalum.

3. A method according to claim 1, wherein said third conductive layer comprises tantalum.

4. A method according to claim 1, wherein said mask is narrower than in the direction of the length of a channel region than said gate electrode.

5. A method according to claim 1, wherein said semiconductor device is an electronic device selected from the group consisting of a video camera, a digital camera, a projector, a goggle display, a car navigation system, a personal computer, and a personal digital assistant.

6. A method for manufacturing a semiconductor device comprising the steps of:

forming a semiconductor film over a substrate;

forming a gate insulating film over said semiconductor film;

forming a first mask over said gate insulating film;

forming first impurity regions in said semiconductor film by introducing a first impurity element by using said first mask;

removing said first mask;

forming a gate electrode over said gate insulating film so that said gate electrode partially overlaps said first impurity regions;

forming a second mask over said gate electrode;

forming second impurity regions in said semiconductor film by introducing a second impurity element by using said second mask; and annealing said semiconductor film so that said first and second impurity elements therein are activated, wherein said gate electrode comprises a multilayer film including in consequence a first conductive layer, a second conductive layer and a third conductive layer, wherein said second conductive layer comprises aluminum.

7. A method according to claim 6, wherein said first conductive layer comprises tantalum.

8. A method according to claim 6, wherein said third conductive layer comprises tantalum.

9. A method according to claim 6, wherein said mask is narrower than in the direction of the length of a channel region than said gate electrode.

10. A method according to claim 6, wherein said first mask is narrower in the direction of the length of a channel region than said gate electrode.

11. A method according to claim 6, wherein said semiconductor device is an electronic device selected from the group consisting of a video camera, a digital camera, a projector, a goggle display, a car navigation system, a personal computer, and a personal digital assistant.

12. A method for manufacturing a semiconductor device comprising the steps of:

forming a semiconductor film over a substrate;

forming a gate insulating film over said semiconductor film;

forming a first mask over said gate insulating film;

forming first impurity regions in said semiconductor film by introducing a first impurity element by using said first mask;

removing said first mask;

forming a gate electrode over said gate insulating film so that said gate electrode partially overlaps said first impurity regions;

forming a second mask over said gate electrode, said second mask being wider in the direction of the length of a channel region than said gate electrode;

forming second impurity regions in said semiconductor film by introducing a second impurity element by using said second mask; and annealing said semiconductor film so that said first and second impurity elements therein are activated, wherein said gate electrode comprises a multilayer film including in consequence a first conductive layer, a second conductive layer and a third conductive layer, wherein said second conductive layer comprises aluminum.

13. A method according to claim 12, wherein said first conductive layer comprises tantalum.

14. A method according to claim 12, wherein said third conductive layer comprises tantalum.

15. A method according to claim 12, wherein said mask is narrower than in the direction of the length of a channel region than said gate electrode.

16. A method according to claim 12, wherein said first mask is narrower in the direction of the length of a channel region than said gate electrode.

17. A method according to claim 12, wherein said semiconductor device is an electronic device selected from the group consisting of a video camera, a digital camera, a projector, a goggle display, a car navigation system, a personal computer, and a personal digital assistant.

18. A method for manufacturing a semiconductor device comprising the steps of:

forming a semiconductor film over a substrate;

forming a gate insulating film over said semiconductor film;

forming a mask over said gate insulating film;

forming impurity regions in said semiconductor film by introducing an impurity element by using said mask;

removing said mask;

forming a gate electrode over said gate insulating film so that said gate electrode partially overlaps said impurity regions, said gate electrode having a multilayer film including in consequence a first conductive layer, a second conductive layer and a third conductive layer;

forming an anodic oxide layer of said gate electrode on side surfaces of said first and second conductive layers and on top and side surfaces of said third conductive layer; and annealing said semiconductor film so that said impurity element therein is activated.

19. A method according to claim 18, wherein said first conductive layer comprises tantalum.

20. A method according to claim 18, wherein said third conductive layer comprises tantalum.

21. A method according to claim 18, wherein said second conductive Layer comprises aluminum.

22. A method according to claim 18, wherein said mask is narrower than in the direction of the length of a channel region than said gate electrode.

23. A method according to claim 18, wherein said semiconductor device is an electronic device selected from the group consisting of a video camera, a digital camera, a projector, a goggle display, a car navigation system, a personal computer, and a personal digital assistant.

24. A method for manufacturing a semiconductor device comprising the steps of:

forming a semiconductor film over a substrate;

forming a gate insulating film over said semiconductor film;

forming a first mask over said gate insulating film;

forming first impurity regions in said semiconductor film by introducing a first impurity element by using said first mask;

removing said first mask;

forming a gate electrode over said gate insulating film so that said gate electrode partially overlaps said impurity regions, said gate electrode having a multilayer film including in consequence a first conductive layer, a second conductive layer and a third conductive layer;

forming a second mask over said gate electrode;

forming second impurity regions in said semiconductor film by introducing a second impurity element by using said second mask; and annealing said semiconductor film so that said first and second impurity elements therein are activated, wherein an anodic oxide layer of said gate electrode is formed on side surfaces of said first and second conductive layers and on top and side surfaces of said third conductive layer.

25. A method according to claim 24, wherein said first conductive layer comprises tantalum.

26. A method according to claim 24, wherein said third conductive layer comprises tantalum.

27. A method according to claim 24, wherein said second conductive layer comprises aluminum.

28. A method according to claim 24, wherein said first mask is narrower in the direction of the length of a channel region than said gate electrode.

29. A method according to claim 24, wherein said semiconductor device is an electronic device selected from the group consisting of a video camera, a digital camera, a projector, a goggle display, a car navigation system, a personal computer, and a personal digital assistant.

30. A method for manufacturing a semiconductor device comprising the steps of:

forming a semiconductor film over a substrate;

forming a gate insulating film over said semiconductor film;

forming a first mask on said gate insulating film;

forming first impurity regions in said semiconductor film by introducing a first impurity element by using said first mask;

removing said first mask;

forming a gate electrode on said gate insulating film so that said gate electrode partially overlaps said impurity regions, said gate electrode having a multilayer film including in consequence a first conductive layer, a second conductive layer and a third conductive layer;

forming a second mask over said gate electrode, said second mask being wider in the direction of the length of a channel region than said gate electrode;

forming second impurity regions in said semiconductor film by introducing a second impurity element by using said second mask; and annealing said semiconductor film so that said first and second impurity elements therein are activated, wherein an anodic oxide layer of said gate electrode is formed on side surfaces of said first and second conductive layers and on top and side surfaces of said third conductive layer.

31. A method according to claim 30, wherein said first conductive layer comprises tantalum.

32. A method according to claim 31, wherein said third conductive layer comprises tantalum.

33. A method according to claim 30, wherein said second conductive layer comprises aluminum.

34. A method according to claim 30, wherein said first mask is narrower in the direction of the length of a channel region than said gate electrode.

35. A method according to claim 30, wherein said semiconductor device is an electronic device selected from the group consisting of a video camera, a digital camera, a projector, a goggle display, a car navigation system, a personal computer, and a personal digital assistant.

* * * * *